(12) United States Patent
Hendriks et al.

(10) Patent No.: US 7,308,172 B2
(45) Date of Patent: Dec. 11, 2007

(54) SYSTEM FOR READING DATA STORED ON AN INFORMATION CARRIER

(75) Inventors: Robert Frans Maria Hendriks, Eindhoven (NL); Coen Theodorus Hubertus Fransiscus Liedenbaum, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 60 days.

(21) Appl. No.: 10/571,831

(22) PCT Filed: Sep. 2, 2004

(86) PCT No.: PCT/IB2004/002887

§ 371 (c)(1),
(2), (4) Date: Mar. 15, 2006

(87) PCT Pub. No.: WO2005/027108

PCT Pub. Date: Mar. 24, 2005

(65) Prior Publication Data

US 2007/0104406 A1    May 10, 2007

(30) Foreign Application Priority Data

Sep. 18, 2003   (EP)   ................... 03300124

(51) Int. Cl.
*G02B 6/34* (2006.01)
*G11C 7/00* (2006.01)
*G11B 7/00* (2006.01)

(52) U.S. Cl. .................... 385/37; 365/215; 369/112.27
(58) Field of Classification Search .................... 385/4, 385/14, 29, 37; 365/189.01, 189.04, 215; 369/44.12, 44.32, 112.27

See application file for complete search history.

(56) References Cited

U.S. PATENT DOCUMENTS 5,044,718 A * 9/1991 Kando ........................ 385/4
5,495,462 A * 2/1996 Nishiwaki et al. ............ 385/29

FOREIGN PATENT DOCUMENTS

| JP | 07169090 | 4/1995 |
|----|----------|--------|
| JP | 2001184702 | 6/2001 |
| WO | WO9931658 | 6/1999 |

OTHER PUBLICATIONS

Other ISR.
Written Opinion.

* cited by examiner

*Primary Examiner*—Quyen P Leung
(74) *Attorney, Agent, or Firm*—Michael E. Belk

(57) ABSTRACT

The invention relates to a system for reading data stored on an information carrier. The system comprises a waveguide (1203) which allows displacing laterally the different components in exploiting the reflection of the light beams between a first surface (1207) and a second surface (1208) of said wave guide (1203). Use: Optical storage.

9 Claims, 17 Drawing Sheets

SYSTEM FOR READING DATA STORED ON AN INFORMATION CARRIER

FIELD OF THE INVENTION

The invention relates to a system for reading data stored on an information carrier.

The invention also relates to various apparatus comprising such a system.

The invention may be used, for example, in the field of optical data storage.

BACKGROUND OF THE INVENTION

Use optical storage is nowadays widespread for content distribution, for example in storage systems based on the DVD (Digital Versatile Disk) standards. Optical storage has a big advantage over hard-disk and solid-state storage in that information carriers are easy and cheap to duplicate.

However, due to the large amount of moving parts in the drives, known applications using this type of storage are not robust to shocks when performing read operations, considering the required stability of said moving parts during such operations. As a consequence, optical storage cannot easily be used in applications which are subject to shocks, such as in portable devices.

OBJECT AND SUMMARY OF THE INVENTION

It is an object of the invention to propose a planar system for reading data stored on an information carrier.

A first family of a planar system according to the invention for reading data stored on an information carrier comprises:
a waveguide comprising a first surface and a second surface,
an array of apertures placed on the side of said first surface for generating a first light beam from an input light beam,
first reflection means placed on the side of said second surface for generating a first reflected light beam from said first light beam,
a reflective phase-modulator placed on the side of said first surface for generating a phase-modulated light beam from said first reflected light beam,
second reflection means placed on the side of said second surface for generating a second reflected light beam from said phase-modulated light beam, said second reflected light beam being intended to scan the information carrier,
a detector for detecting said data from an output light beam generated by the information carrier.

A second family of a planar system according to the invention for reading data stored on an information carrier comprises:
a waveguide comprising a first surface and a second surface, the information carrier being intended to be placed on the side of said second surface,
an array of apertures placed on the side of said first surface for generating a first light beam from an input light beam,
first reflection means placed on the side of said second surface for generating a first reflected light beam from said first light beam,
a reflective phase-modulator placed on the side of said first surface for generating a phase-modulated light beam from said first reflected light beam,
second reflection means placed on the side of said second surface for generating a second reflected light beam from said phase-modulated light beam,
a reflective polarizer plate placed on the side of said first surface for generating a third reflected light beam from said second reflected light beam, said third reflected light beam being intended to pass through a quarter-wavelength plate placed between said second reflection means and the information carrier, and being intended to scan the information carrier,
a detector placed below the reflective polarizer plate for detecting said data from an output light beam generated by the information carrier.

The planar systems according to the invention are dedicated to the reading of a planar information carrier by an array of light spots. The waveguide allows displacing laterally the different components defining the light spots. The building height is thus reduced due to the fact that various components are located next to each other instead of being stacked. This assembly facilitates the implementation in an apparatus for reading an information carrier.

Since the information carrier can either be read out in transmission or in reflection, the planar systems allows reading either a transparent or a non-transparent information carrier. With a non-transparent information carrier, no more strict requirements on information carrier thickness or quality of the back surface are required. The back surface can for instance be printed with text or images indicating the contact of the information carrier. Moreover, in that case, only one surface of the information carrier needs to be protected against contamination.

Detailed explanations and other aspects of the invention will be given below.

BRIEF DESCRIPTION OF THE DRAWINGS

The particular aspects of the invention will now be explained with reference to the embodiments described hereinafter and considered in connection with the accompanying drawings, in which identical parts or sub-steps are designated in the same manner.

DETAILED DESCRIPTION OF THE INVENTION

The system according to the invention aims at reading data stored on an information carrier. The information carrier is intended to store binary data organized according to an array, as in a data matrix. If the information carrier is intended to be read in transmission, the states of binary data stored on the information carrier are represented by transparent areas and non-transparent areas (i.e. light-absorbing). Alternatively, if the information carrier is intended to be read in reflection, the states of binary data stored on the information carrier are represented by non-reflective areas (i.e. light-absorbing) and reflective areas. The areas are marked in a material such as glass, plastic or a material having magnetic properties.

The system according to the invention comprises:

an optical element for generating an array of light spots from an input light beam, said array of light spots being intended to scan said information carrier, a detector for detecting said data from an array of output light beams generated by said information carrier.

Figure 1:
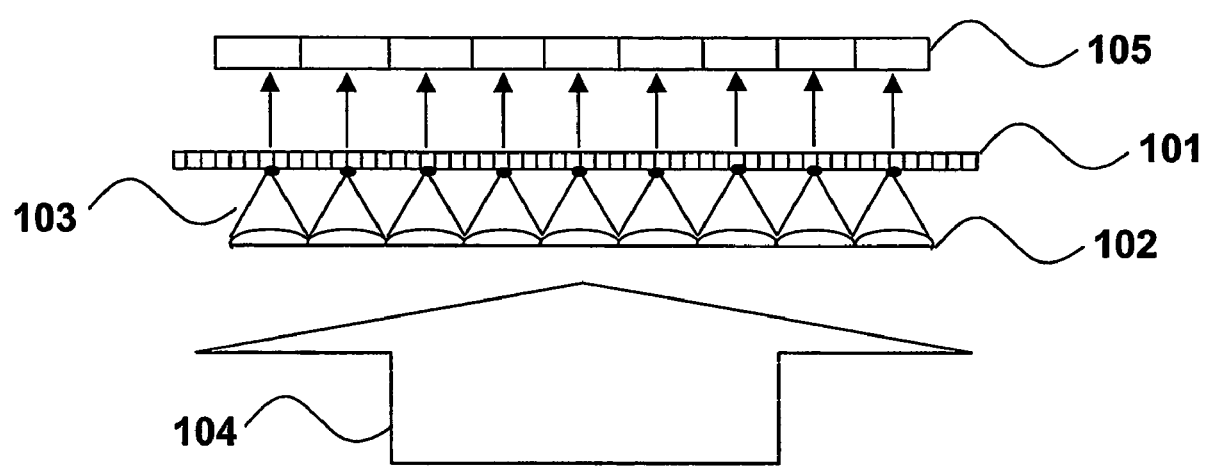
FIG. 1 depicts a first system according to the invention.

In a first embodiment depicted in FIG. 1, the system according to the invention for reading data stored on an information carrier 101 comprises an optical element 102 for generating an array of light spots 103 from an input light beam 104, said array of light spots 103 being intended to scan the information carrier 101.

The optical element 102 corresponds to a two-dimensional array of micro-lenses to the input of which the coherent input light beam 104 is applied. The array of micro-lenses 102 is placed parallel and distant from the information carrier 101 so that light spots are focussed on the information carrier. The numerical aperture and quality of the micro-lenses determines the size of the light spots. For example, a two-dimensional array of micro-lenses 102 having a numerical aperture which equals 0.3 can be used. The input light beam 104 can be realized by a waveguide (not represented) for expanding an input laser beam, or by a two-dimensional array of coupled micro lasers.

The light spots are applied on transparent or non-transparent areas of the information carrier 101. If a light spot is applied on a non-transparent area, no output light beam is generated in response by the information carrier. If a light spot is applied on a transparent area, an output light beam is generated in response by the information carrier, said output light beam being detected by the detector 105. The detector 105 is thus used for detecting the binary value of the data of the area to which the optical spot is applied.

The detector 105 is advantageously made of an array of CMOS or CCD pixels. For example, one pixel of the detector is placed opposite an elementary data area containing one data (i.e. one bit) of the information carrier. In that case, one pixel of the detector is intended to detect one data of the information carrier.

Advantageously, an array of micro-lenses (not represented) is placed between the information carrier 101 and the detector 105 for focusing the output light beams generated by the information carrier on the detector, for improving the detection of the data.

Figure 2:
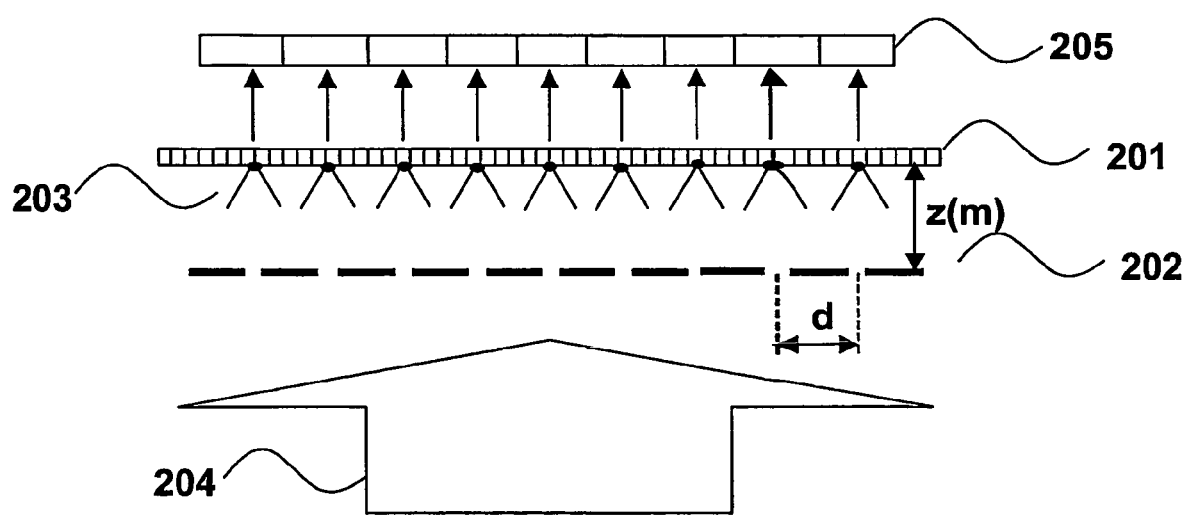
FIG. 2 depicts a second system according to the invention.

In a second embodiment depicted in FIG. 2, the system according to the invention for reading data stored on an information carrier 201 comprises an optical element 202 for generating an array of light spots 203 from an input light beam 204, said array of light spots 203 being intended to scan the information carrier 201.

The optical element 202 corresponds to a two-dimensional array of apertures to the input of which the coherent input light beam 204 is applied. The apertures correspond for example to circular holes having a diameter of 1 μm or much smaller. The input light beam 204 can be realized by a waveguide (not represented) for expanding an input laser beam, or by a two-dimensional array of coupled micro lasers.

The light spots are applied to transparent or non-transparent areas of the information carrier 201. If a light spot is applied to a non-transparent area, no output light beam is generated in response by the information carrier. If a light spot is applied to a transparent area, an output light beam is generated in response by the information carrier, said output light beam being detected by the detector 205. Similarly as the first embodiment depicted in FIG. 1, the detector 205 is thus used for detecting the binary value of the data of the area on which the optical spot is applied.

The detector 205 is advantageously made of an array of CMOS or CCD pixels. For example, one pixel of the detector is placed opposite an elementary data area containing a data of the information carrier. In that case, one pixel of the detector is intended to detect one data of the information carrier.

Advantageously, an array of micro-lenses (not represented) is placed between the information carrier 201 and the detector 205 for focusing the output light beams generated by the information carrier on the detector, improving the detection of the data.

The array of light spots 203 is generated by the array of apertures 202 in exploiting the Talbot effect which is a diffraction phenomenon working as follows. When a coherent light beams, such as the input light beam 204, is applied to an object having a periodic diffractive structure (thus forming light emitters), such as the array of apertures 202, the diffracted lights recombine into identical images of the emitters at a plane located at a predictable distance z0 from the diffracting structure. This distance z0 is known as the Talbot distance. The Talbot distance z0 is given by the relation $z0 = 2.n.d^2/\lambda$, where d is the periodic spacing of the light emitters, $\lambda$ is the wavelength of the input light beam, and n is the refractive index of the propagation space. More generally, re-imaging takes place at other distances z(m) spaced further from the emitters and which are a multiple of the Talbot distance z such that $z(m) = 2.n.m.d^2/\lambda$, where m is an integer. Such a re-imaging also takes place for m=½+ an integer, but here the image is shifted over half a period. The re-imaging also takes place for m=¼+ an integer, and for m=¾+ an integer, but the image has a doubled frequency which means that the period of the light spots is halved with respect to that of the array of apertures.

Exploiting the Talbot effect allows to generate an array of light spots of high quality at a relatively large distance from the array of apertures 202 (a few hundreds of μm, expressed by z(m)), without the need for optical lenses. This allows to insert for example a cover layer between the array of aperture 202 and the information carrier 201 to prevent the latter from contamination (e.g. dust, finger prints . . . ). Moreover, this facilitates the implementation and allows to increase in a cost-effective manner, compared to the use of an array of micro-lenses, the density of light spots which are applied to the information carrier.

Figure 3:
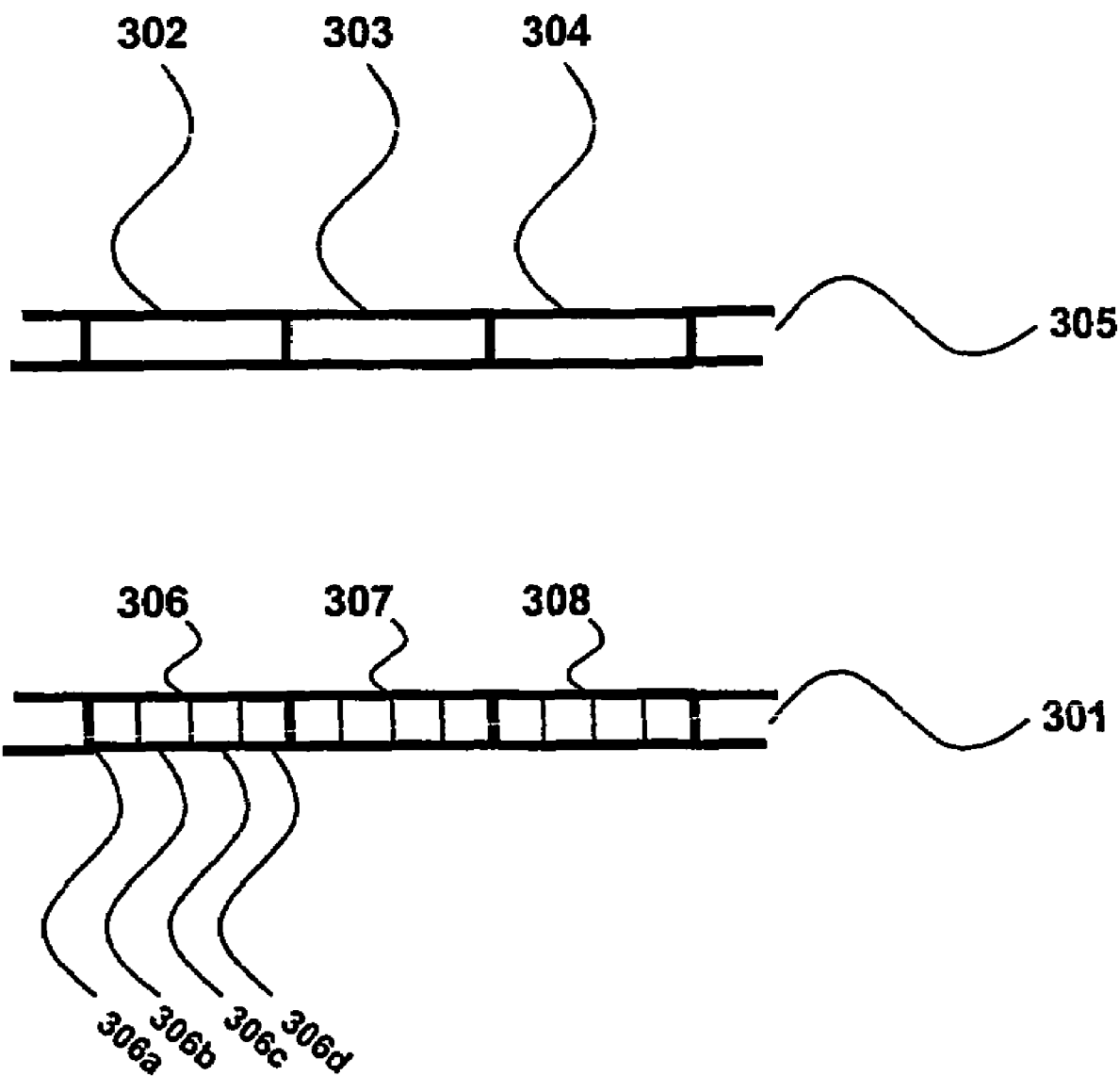
FIG. 3 depicts a detailed view of components dedicated to macro-cell scanning used in systems according to the invention, FIG. 4 illustrate the principle of macro-cell scanning according to the invention.

FIG. 3 depicts a detailed view of the system according to the invention. It depicts a detector 305 which is intended to detect data from output light beams generated by the information carrier 301. The detector comprises pixels referred to as 302-303-304, the number of pixels shown being limited to facilitate the understanding. In particular, pixel 302 is intended to detect data stored on the data area 306 of the information carrier, pixel 303 is intended to detect data stored on the data area 307, and pixel 304 is intended to detect data stored on the data area 308. Each data area (also called macro-cell) comprises a set of elementary data. For example, data area 306 comprises binary data referred to as 306a-306b-306c-306d.

In this embodiment, one pixel of the detector is intended to detect a set of data, each elementary data among this set of data being successively read by a single light spot generated either by the array of micro-lenses 102 depicted in FIG. 1, or by the array of apertures depicted in FIG. 2. This way of reading data on the information carrier is called macro-cell scanning in the following.

Figure 4:
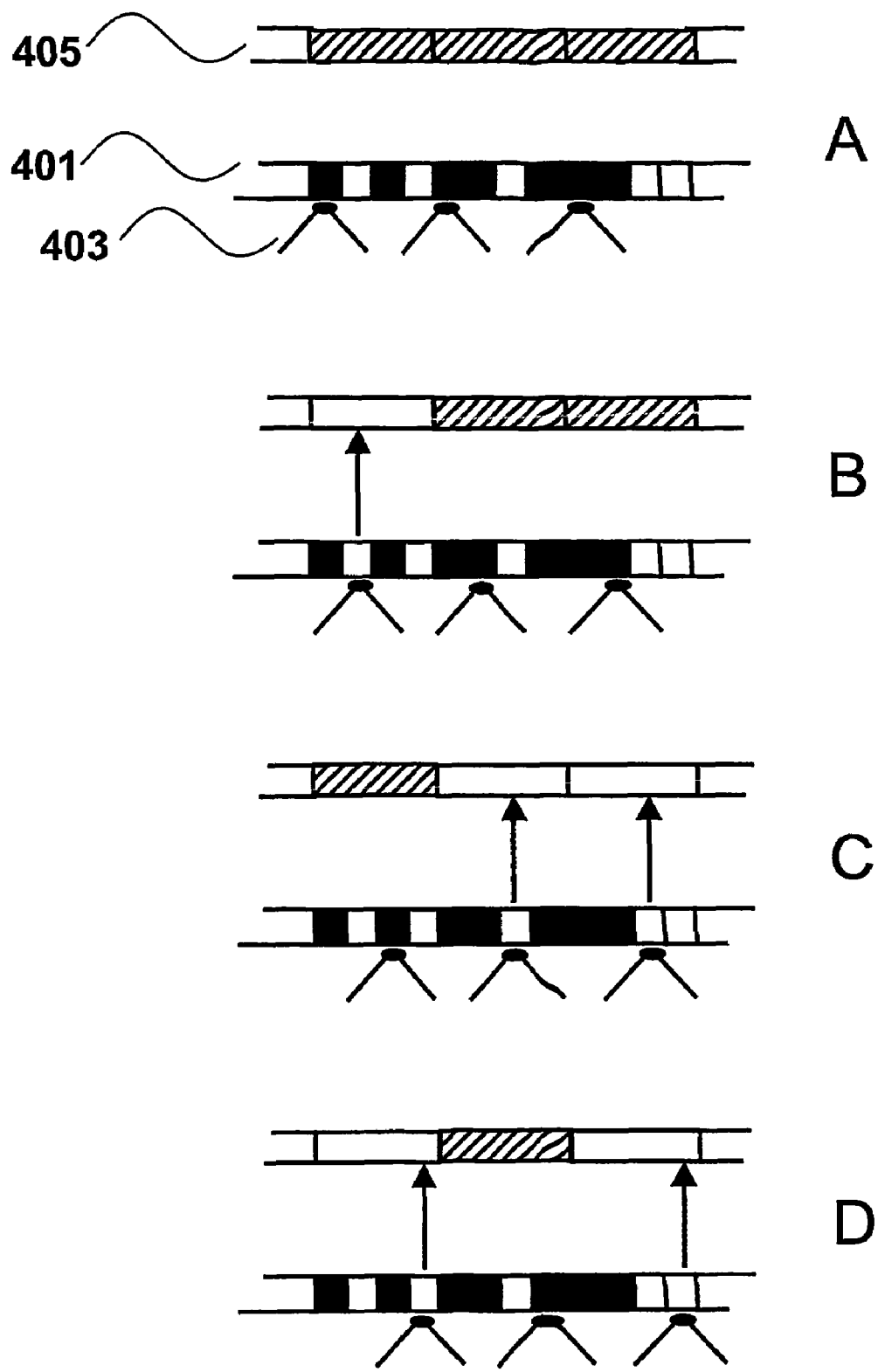

FIG. 4, which is based on FIG. 3, illustrates by a non-limitative example the macro-cell scanning of an information carrier 401.

Data stored on the information carrier 401 have two states indicated either by a black area (i.e. non-transparent) or white area (i.e. transparent). For example, a black area corresponds to a "0" binary state while a white area corresponds to a "1" binary state.

When a pixel of the detector 405 is illuminated by an output light beam generated by the information carrier 401, the pixel is represented by a white area. In that case, the pixel delivers an electric output signal (not represented) having a first state. On the contrary, when a pixel of the detector 405 does not receive any output light beam from the information carrier, the pixel is represented by a cross-hatched area. In that case, the pixel delivers an electric output signal (not represented) having a second state.

In this example, each set of data comprises four elementary data, and a single light spot is applied simultaneously to each set of data. The scanning of the information carrier 401 by the light spots 403 is performed for example from left to right, with an incremental lateral displacement which equals the distance between two elementary data.

In position A, all the light spots are applied to non-transparent areas so that all pixels of the detector are in the second state.

In position B, after displacement of the light spots to the right, the light spot to the left is applied to a transparent area so that the corresponding pixel is in the first state, while the two other light spots are applied to non-transparent areas so that the two corresponding pixels of the detector are in the second state.

In position C, after displacement of the light spots to the right, the light spot to the left is applied to a non-transparent area so that the corresponding pixel is in the second state, while the two other light spots are applied to transparent areas so that the two corresponding pixels of the detector are in the first state.

In position D, after displacement of the light spots to the right, the central light spot is applied to a non-transparent area so that the corresponding pixel is in the second state, while the two other light spots are applied to transparent areas so that the two corresponding pixels of the detector are in the first state.

The scanning of the information carrier 401 is complete when the light spots have been applied to all data of a set of data facing a pixel of the detector. It implies a two-dimensional scanning of the information carrier. Elementary data which compose a set of data opposite a pixel of the detector are read successively by a single light spot.

Figure 5:
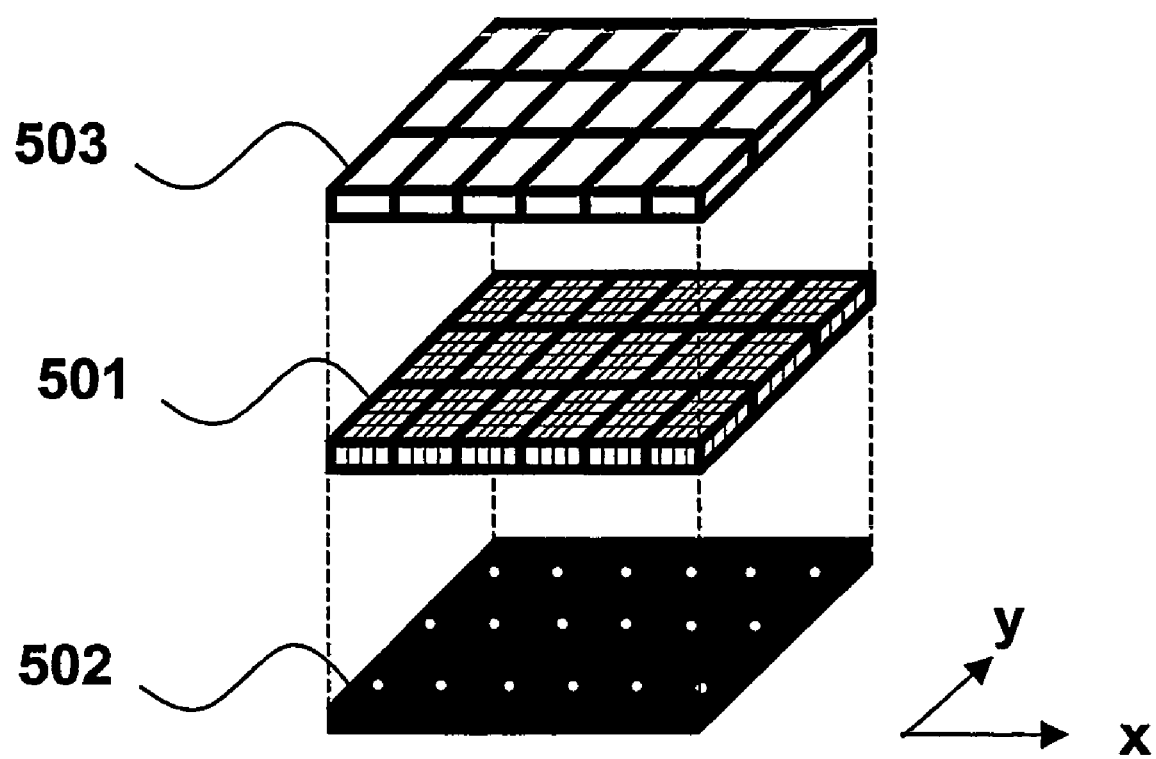
FIG. 5 depicts a three-dimensional view of the first system according to the invention.

FIG. 5 depicts a three-dimensional view of the system as depicted in FIG. 2. It comprises an array of apertures 502 for generating an array of light spots applied to the information carrier 501. Each light spot is applied and scanned over a two-dimensional set of data of the information carrier 501 (represented by bold squares). In response to this light spot, the information carrier generates (or not, if the light spot is applied to a non-transparent area) an output light beam in response, which is detected by the pixel of the detector 503 opposite the set of data which is scanned. The scanning of the information carrier 501 is performed in displacing the array of apertures 502 along the x and y axes.

The array of apertures 502, the information carrier 501 and the detector 503 are stacked in parallel planes. The only moving part is the array of apertures 502.

It is noted that the three-dimensional view of the system as depicted in FIG. 1 would be the same as the one depicted in FIG. 5 in replacing the array of apertures 502 by the array of micro-lenses 102.

The scanning of the information carrier by the array of light spots is done in a plane parallel to the information carrier. A scanning device provides translational movement of the light spots in the two directions x and y for scanning all the surface of the information carrier.

Figure 6:
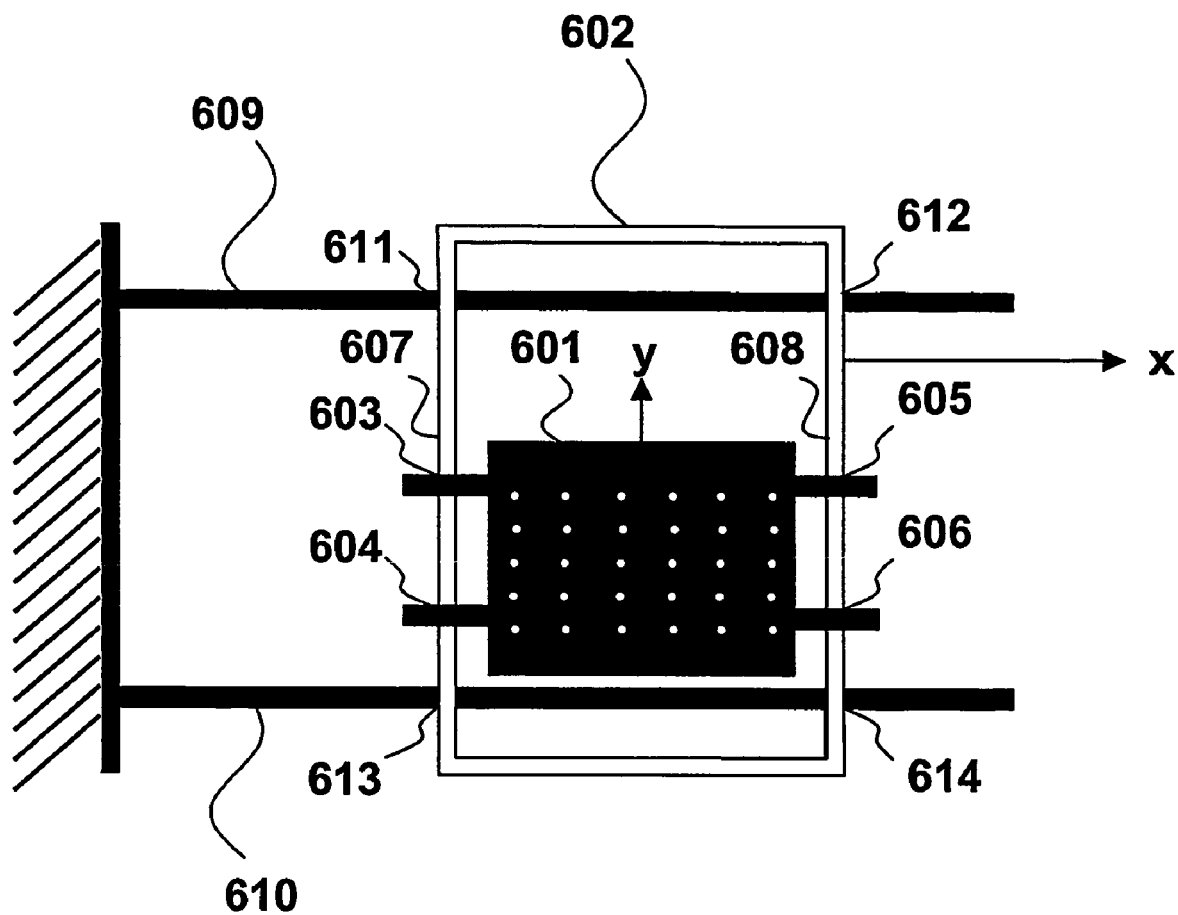
FIG. 6 depicts a first arrangement for moving the systems according to the invention over an information carrier.

In a first solution depicted in FIG. 6, the scanning device corresponds to an H-bridge. The optical element generating the array of light spots (i.e. the array of micro-lenses or the array of apertures) is implemented in a first sledge 601 which is movable along the y axis compared to a second sledge 602. To this end, the first sledge 601 comprises joints 603-604-605-606 in contact with guides 607-608. The second sledge 602 is movable along the x axis by means of joints 611-612-613-614 in contact with guides 609-610. The sledges 601 and 602 are translated by means of actuators (not represented), such as by step-by-step motors, magnetic or piezoelectric actuators acting as jacks.

Figure 7:
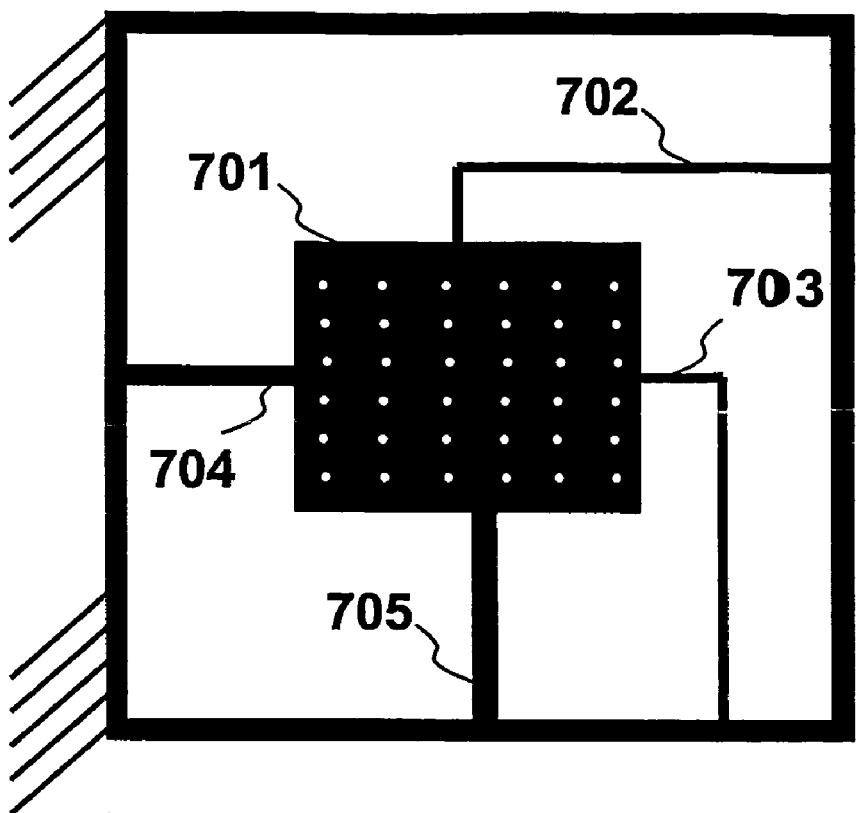
FIG. 7 depicts a second arrangement for moving the systems according to the invention over an information carrier.
Figure 7:
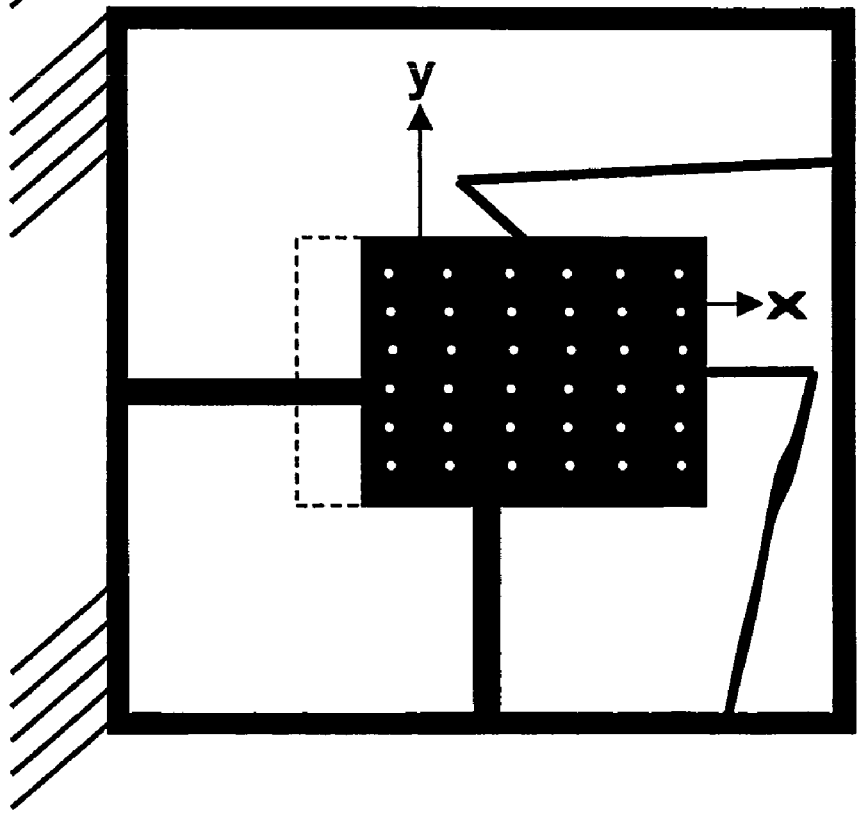
Figure 8:
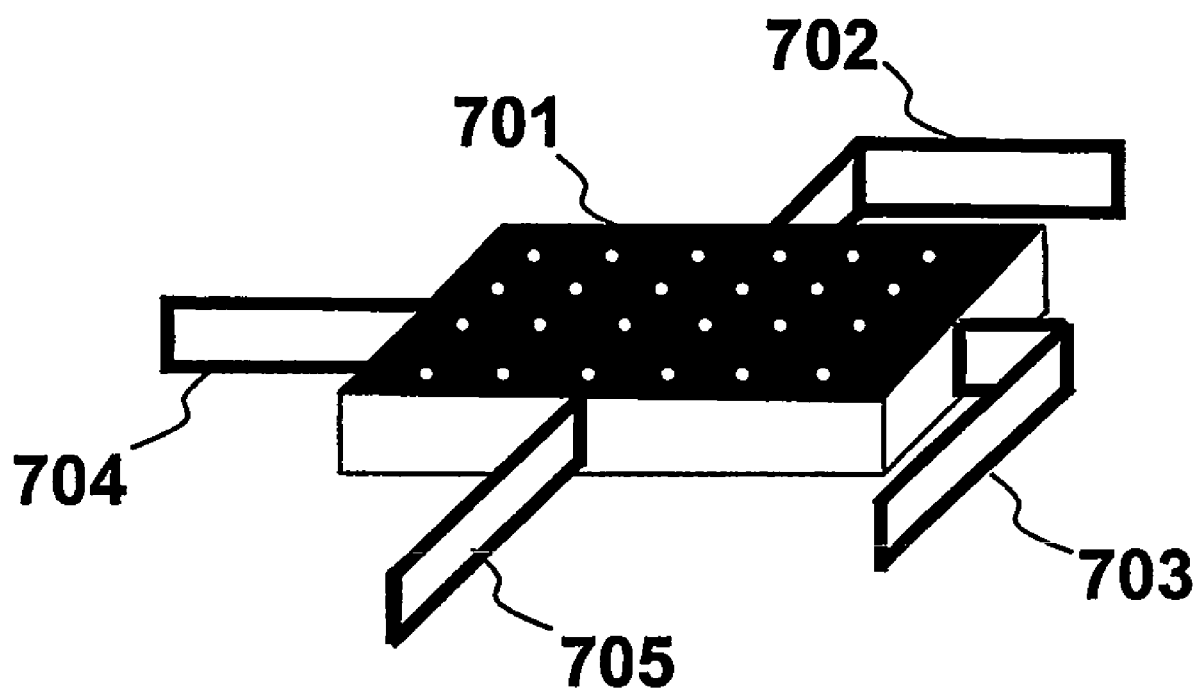
FIG. 8 depicts detailed elements of the second arrangement for moving the systems according to the invention over an information carrier.

In a second solution depicted in FIG. 7, the scanning device is maintained in a frame 701. The elements used for suspending the frame 701 are depicted in a detailed three-dimensional view in FIG. 8. These elements comprise:
a first leaf spring 702,
a second leaf spring 703,
a first piezoelectric element 704 providing the actuation of the scanning device 701 along the x axis,
a second piezoelectric element 705 providing the actuation of the scanning device 701 along the y axis.

The second solution depicted in FIG. 7 has less mechanical transmissions than the H-bridge solution depicted in FIG. 6. The piezoelectric elements, in contact with the frame 701, are electrically controlled (not represented) so that a voltage variation results in a dimension change of the piezoelectric elements, leading to a displacement of the frame 701 along the x and/or the y axis.

The position Pos1 depicts the scanning device 701 in a first position, while the position Pos2 depicts the scanning device 701 in a second position after translation along the x axis. The flexibility of the leaf springs 702 and 703 is put in evidence.

A similar configuration can be built with four piezoelectric elements, the two extra piezoelectric elements replacing the leaf springs 702 and 703. In that case, opposite pair of piezoelectric elements act together in one direction in the same way as an antagonistic pair of muscles.

Figure 9:
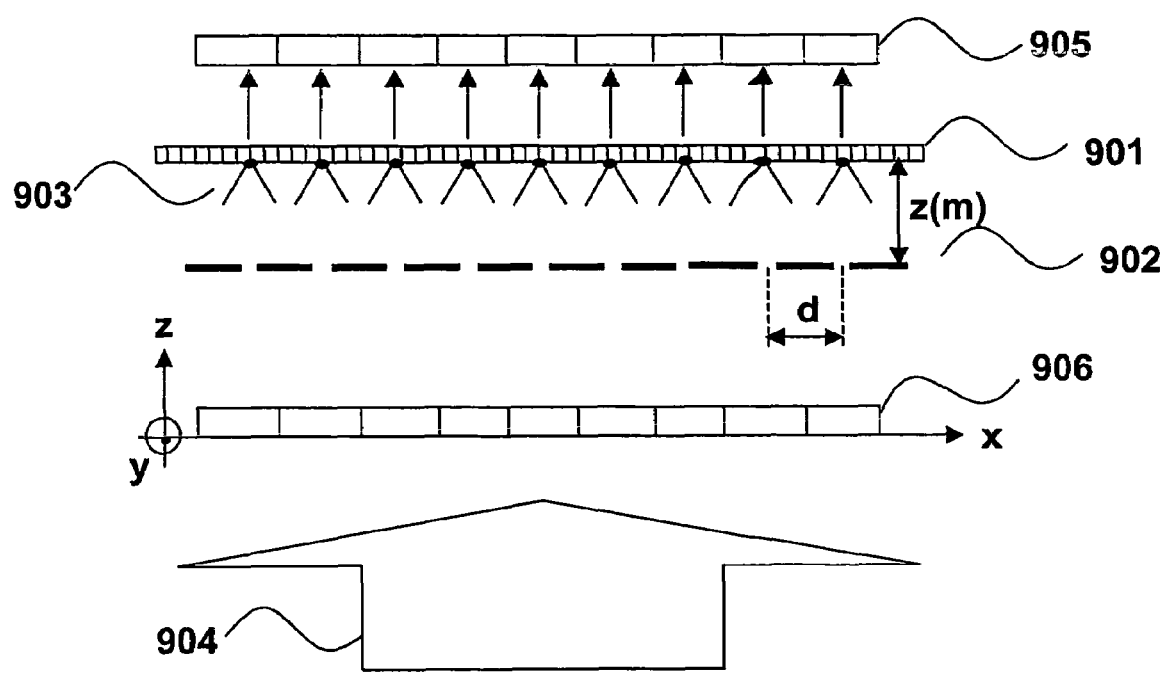
FIG. 9 depicts a third system according to the invention.

FIG. 9 depicts an improved system according to the invention in which the scanning of the information carrier 901 is realized without moving components. FIG. 9 is based on FIG. 2 but additionally comprises a phase-modulator 906 placed in the path light of the input light beam 904.

The non-mechanical scanning is realized by applying a phase profile defined by the phase-modulator 906 to the input light beam 904, and in varying this phase profile. The phase-modulator 906 varies the phase of the input light beam 904 with respect to the lateral distance x (and/or y).

It is noted that the phase-modulator 906 can also be placed between the array of apertures 902 and the information carrier 901 (not represented).

When the phase-modulator 906 acts so as the phase $\phi(x)$ varies in a linear way with respect to the position x, this leads to a lateral shift $\Delta x$ of the array of light spots 903 along the lateral axis x. It can be defined that the phase $\phi(x)$ and the lateral position x are linked by the following relation:

$$\phi(x) = \frac{2\pi}{a} \cdot \frac{x}{\lambda} \qquad \text{Eq. 1}$$

where
x is the lateral position (taken for example from the extreme left side of the phase-modulator 906),
$\lambda$ is the wavelength of the input light beam 904,
a is a variable parameter.

It can be shown that if a phase profile as defined by Eq. 1 is performed by the phase-modulator 906, the lateral shift $\Delta x$ of the array of light spots 903 is given by the following relation:

$$\Delta x = a \cdot Z \qquad \text{Eq. 2}$$

where Z is fixed value corresponding advantageously to the Talbot distance z0, or to an integer multiple or a sub-multiple of the Talbot distance z0, The parameter a allows modifying the linearity factor of the phase profile in view of changing the lateral shift $\Delta x$. For each value of the parameter a, a different phase profile is defined. A variation of the parameter a results as a consequence in a shift spots in x.

For scanning all the surface of the information carrier 901, each macro-cell data of the information carrier must be scanned by a light spot of the array of spots. The scanning of a macro-cell data thus corresponds to a two-dimensional scanning along the x and y axis. This two-dimensional scanning is performed in defining simultaneously a linear phase modulation according to the x and y axis, the defined phase profile resulting from a linear combination of a linear phase profile according to the x (as defined by Eq. 1) axis and a linear phase profile according to the y axis (similarly as defined by Eq. 1 in substituting x by y).

The phase-modulator 906 comprises advantageously controllable liquid crystal (LC) cells. For example, pixelated linear nematic LC cells can be used such that each aperture of the array of apertures 902 has its own LC cell, and can be given its own phase $\phi(x)$. Thus, the phase-modulator 906 corresponds to a two-dimensional array of LC cells. Nematic substances can be aligned by electric and magnetic fields, resulting in a phase change. Nematic cells are optically equivalent to a linear wave plate having a fixed optical axis, but whose birefringence is a function of the applied voltage. As the applied voltage varies, the birefringence changes, resulting in a change of the optical path length, thus in a phase change.

Since each of the apertures of the array of apertures 902 has its own LC cell, the phase profile defines a ramp having incremental steps, the ramp globally fitting a linear equation defined by Eq. 1.

Alternatively, the phase-modulator 906 may define a continuous preset phase profile which is electrically controllable for varying the linearity factor of the phase profile.

Alternatively, electro-wetting cells can be used for defining the phase profile. In this case, the phase profile according to the lateral position x is changed by applying different high voltages to the electro-wetting cell.

Alternatively, the array of light spots can be shifted on the information carrier in varying the incident angle of the input light beam 904 from the axial direction z. This solution is advantageous since it no more requires a phase-modulator placed on the path light. It requires however actuation means (not represented) for varying the angle of the light beam 904. When the angle of the light beam is a with respect to the surface normal of the aperture array, the phase profile corresponds to the one defined by Eq. 1.

Figure 10:
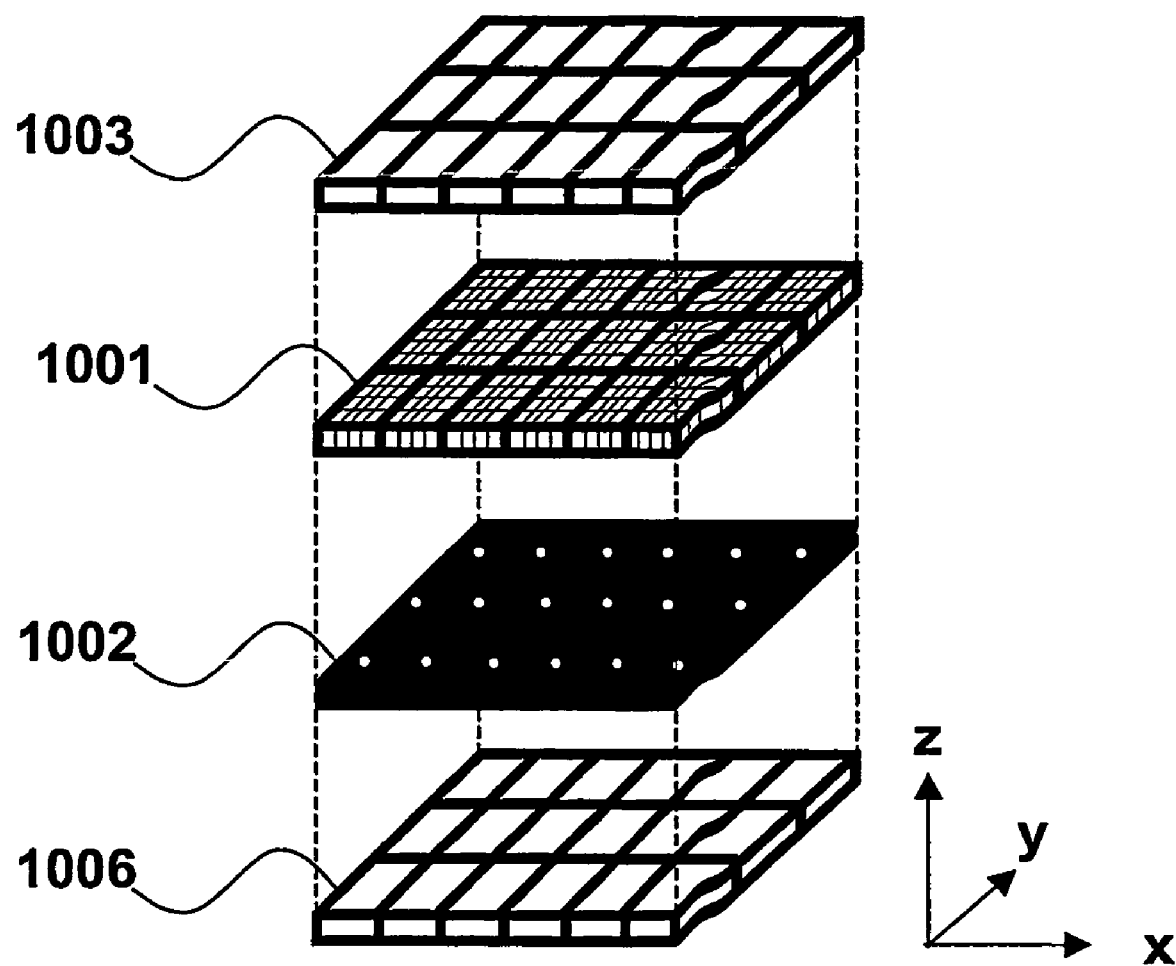
FIG. 10 depicts a three-dimensional view of the third system according to the invention.

FIG. 10 depicts a three-dimensional view of the system as depicted in FIG. 9. It comprises an array of apertures 1002 for generating an array of light spots applied to the information carrier 1001. Each light spot is applied and scanned over a two-dimensional set of data of the information carrier 1001 (represented by squares in bold). In response to this light spot, the information carrier generates (or not, if the light spot is applied to a non-transparent area) an output light beam detected by the pixel of the detector 1003 opposite the set of data which is scanned. The scanning of the information carrier 1002 along the x and y axis is performed by means of a phase-modulator 1006 placed below the array of apertures 1002, without moving any elements.

The phase-modulator 1006, the array of apertures 1002, the information carrier 1001 and the detector 1003 are stacked in parallel planes.

Figure 11:
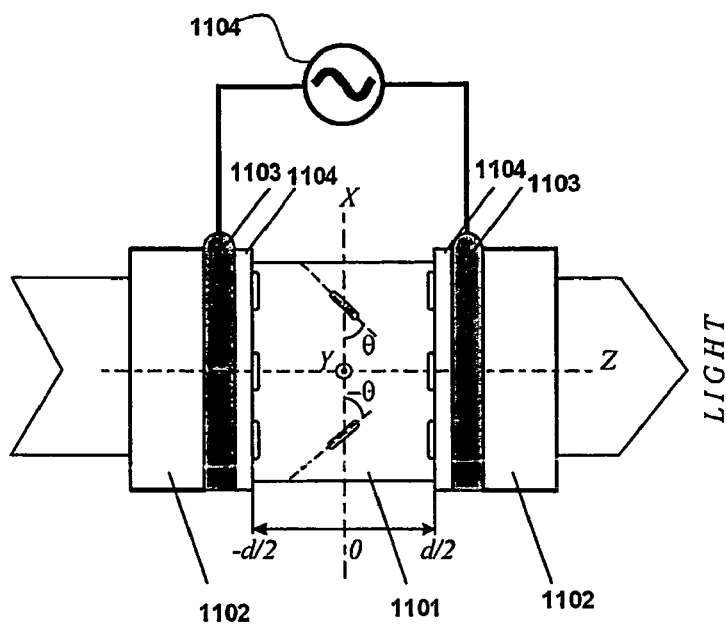
FIG. 11 depicts an electrically controllable liquid crystal cell and a voltage control curve of such a liquid crystal cell.
Figure 11:
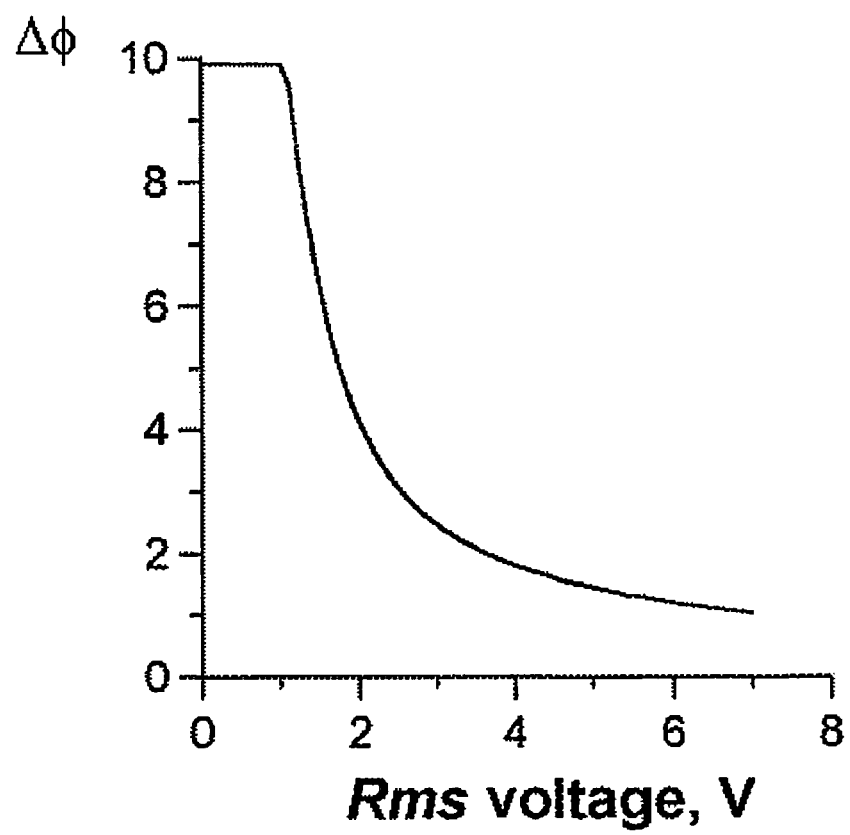

FIG. 11 depicts an example of a LC cell. It comprises an LC layer 1101, a glass substrate 1102, transparent electrodes 1103, alignment layers 1104. In this figure, the parameter d corresponds to the cell thickness, while $\theta$ corresponds to the angle of the LC molecules. As the liquid crystal molecules rotate, due to the applied electric field by the voltage generator 1105, linearly polarised light propagating through the cell will experience a different effective refractive index, resulting in a phase change.

As an example, the resulting graph of a phase change $\Delta\phi$ versus voltage is also illustrated in FIG. 11. The characteristics of the curve depend on the LC material which is used, the wavelength of the light and the cell thickness d.

When the phase-modulator 906 acts so as the phase $\phi(x)$ of the input light beam 904 varies in a quadratic way with respect to the position x, this leads to an axial shift $\Delta z$ of the array of light spots 903 along the axial axis z. It can be defined that the phase $\phi(x)$ and the lateral position x are linked by the following relation:

$$\phi(x) = \frac{2\pi}{2R} \cdot \frac{x^2}{\lambda} \qquad \text{Eq. 3}$$

where x is the lateral position,

λ is the wavelength of the input light beam 904,

R is a variable parameter corresponding to the radius of curvature of the phase profile, Δz is the axial shift with respect to the position for z=0.

It can be shown that if a phase profile as defined by Eq. 3 is performed by the phase-modulator 906, the axial shift Δz of the array of light spots 903 can be accurately approximated by the following relation:

$$\Delta z \approx \frac{Z^2}{R} \qquad \text{Eq. 4}$$

where Z is fixed value corresponding advantageously to the Talbot distance z0, or to an integer multiple or a sub-multiple of the Talbot distance z0.

The variable parameter R allows modifying the quadratic factor of the phase profile in view of changing the axial shift Δz. For each value of the parameter R, a different phase profile is defined. A variation of the parameter R results as a consequence in a shift Δz. The light spots 903 will thus focus closer to or further away from the surface of the information carrier 901. The quadratic phase profile plays the same role as a focus actuator in more traditional recording, but without using any mechanical elements.

Advantageously, the phase profile defined by the phase-modulator 906 may result from a linear combination of a linear phase profile as defined by Eq. 1 (according to the x and/or y axis) and a quadratic phase profile as defined by Eq. 4. This allows performing at the same time a two-dimensional scanning of the light spots, while setting accurately the focus of the light spots on the surface of the information carrier 901.

In an improved embodiment, the different components of the system according to the invention, instead of being stacked as depicted in FIGS. 1-2-8-9-10, are placed next to each other for defining a planar system. This planar system is built on a waveguide comprising a first surface and a second surface. The use of the waveguide allows to laterally displace the different light beams due to reflection between the first surface (i.e. the lower surface) and the second surface (i.e. the upper surface) of the wave guide. The planar system according to the invention is derived according two families.

Figure 12:
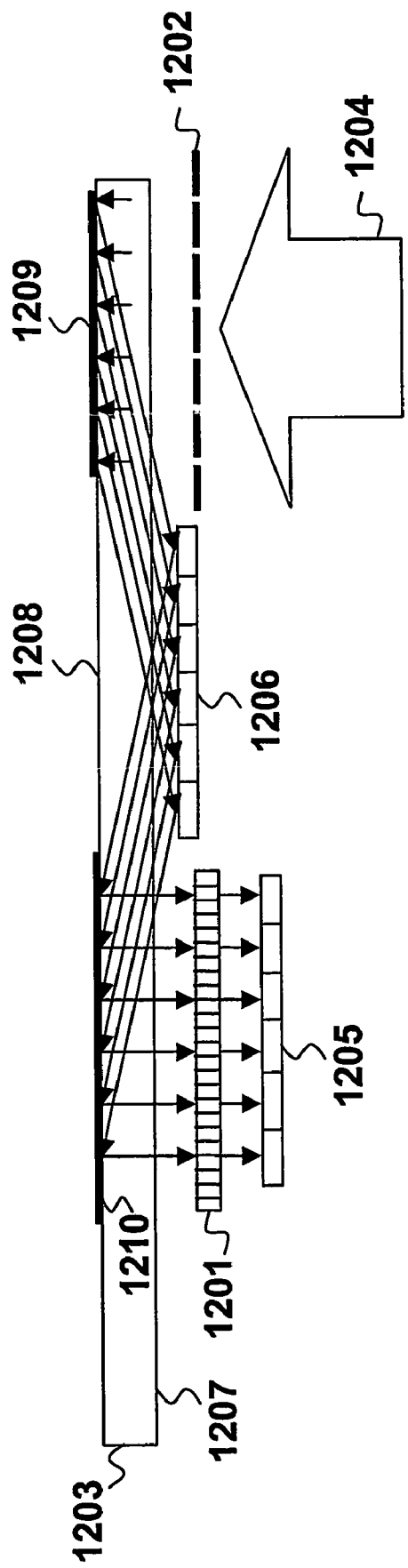
FIG. 12 depicts a first embodiment of a planar system according to the invention.
Figure 13:
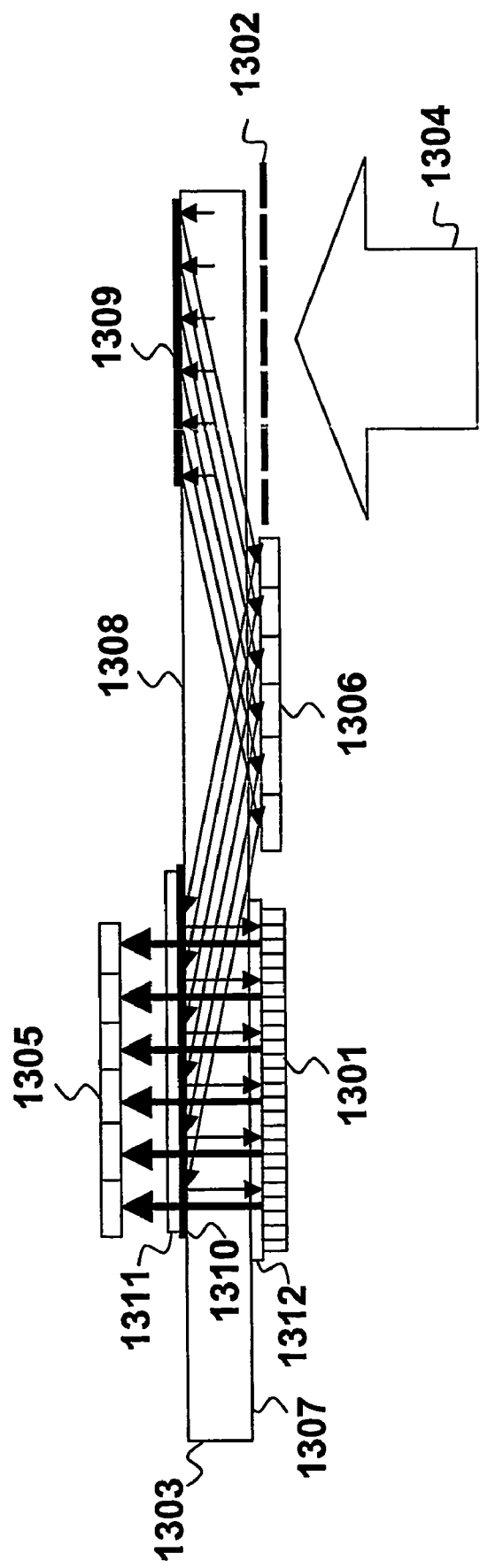
FIG. 13 depicts a second embodiment of a planar system according to the invention.

A first family of a planar system according to the invention for reading data stored on an information carrier is depicted in FIG. 12 and in FIG. 13. This first family of a planar system comprises:

a waveguide 1203-1303 comprising a first surface 1207-1307 and a second surface 1208-1308. The waveguide is made of plastic or glass, or any material having no birefringence or density variations.

an array of apertures 1202-1302 placed on the side of said first surface for generating a first Light beam from an input light beam 1204-1304. The light beam may derive from a laser beam which is expanded by means of an additional waveguide (not-represented).

first reflection means 1209-1309 placed on the side of said second surface for generating a first reflected light beam from said first light beam, a reflective phase-modulator 1206-1306 placed on the side of said first surface for generating a phase-modulated light beam from said first reflected light beam. The phase-modulated light beam comprises an array of light spots as previously described.

second reflection means 1210-1310 placed on the side of said second surface for generating a second reflected light beam from said phase-modulated light beam, said second reflected light beam being intended to scan the information carrier 1201-1301, a detector 1205-1305 for detecting said data from an output light beam generated by the information carrier 1201-1301. The detector, for example of the CMOS type as previously described, advantageously comprises an array of micro-lenses (not represented) for focusing said output light beam on the sensitive cells of the detector.

In the embodiment depicted in FIG. 12, the detector 1205 is placed on the side of said first surface 1207, the information carrier 1201 being intended to be placed between said first surface 1207 and the detector 1205. This particular embodiment implies the use of an information carrier 1201 intended to be read in transmission.

In the embodiment depicted in FIG. 13, the detector 1305 is placed on the side of said second surface 1308. Moreover, the system further comprises:

a reflective polarizer plate 1311 placed between said second reflection means 1310 and the detector 1305, a quarter-wavelength plate 1312 placed between said first surface 1307 and the information carrier 1301.

At the left hand side of the waveguide 1303, the thick arrows pointing upward indicates the light beam coming back from the information carrier 1301. The polarization of this light beam is rotated by means of the quarter-wavelength plate 1312 such that it is directly transmitted through the reflective polarizer plate 1311 (without being deviated by the second reflection means 1310).

This particular embodiment depicted in FIG. 13 implies the use of an information carrier 1301 placed on the side of said first surface 1307 and intended to be read in reflection.

Figure 14:
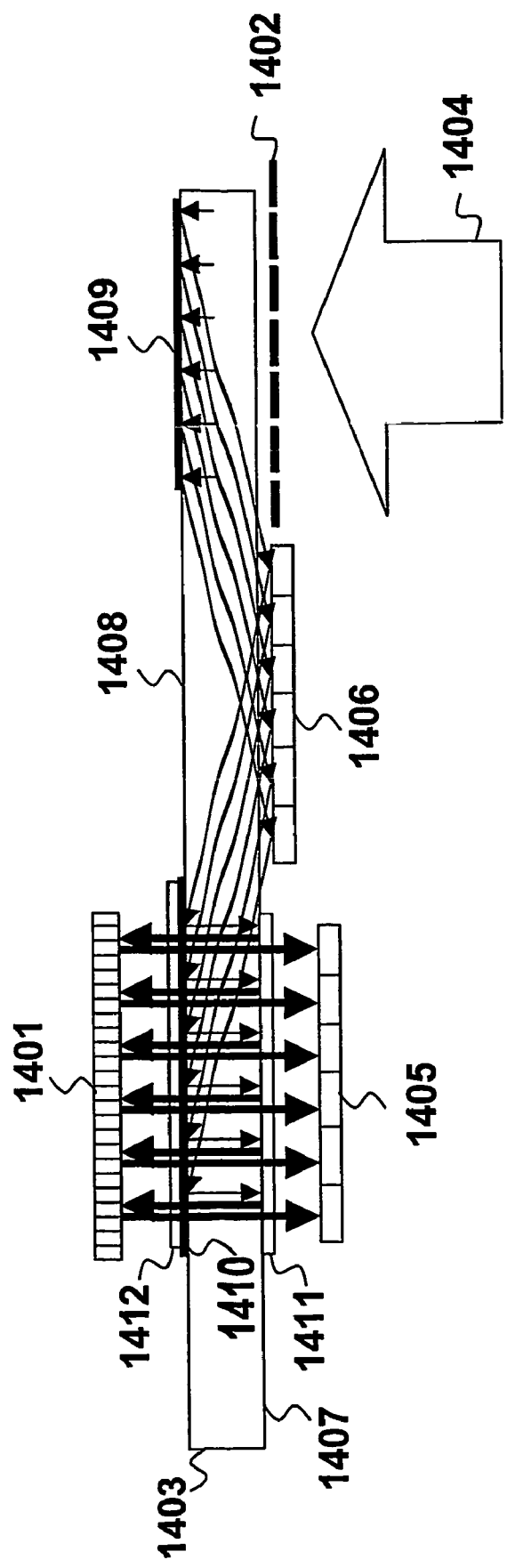
FIG. 14 depicts a third embodiment of a planar system according to the invention.
Figure 15:
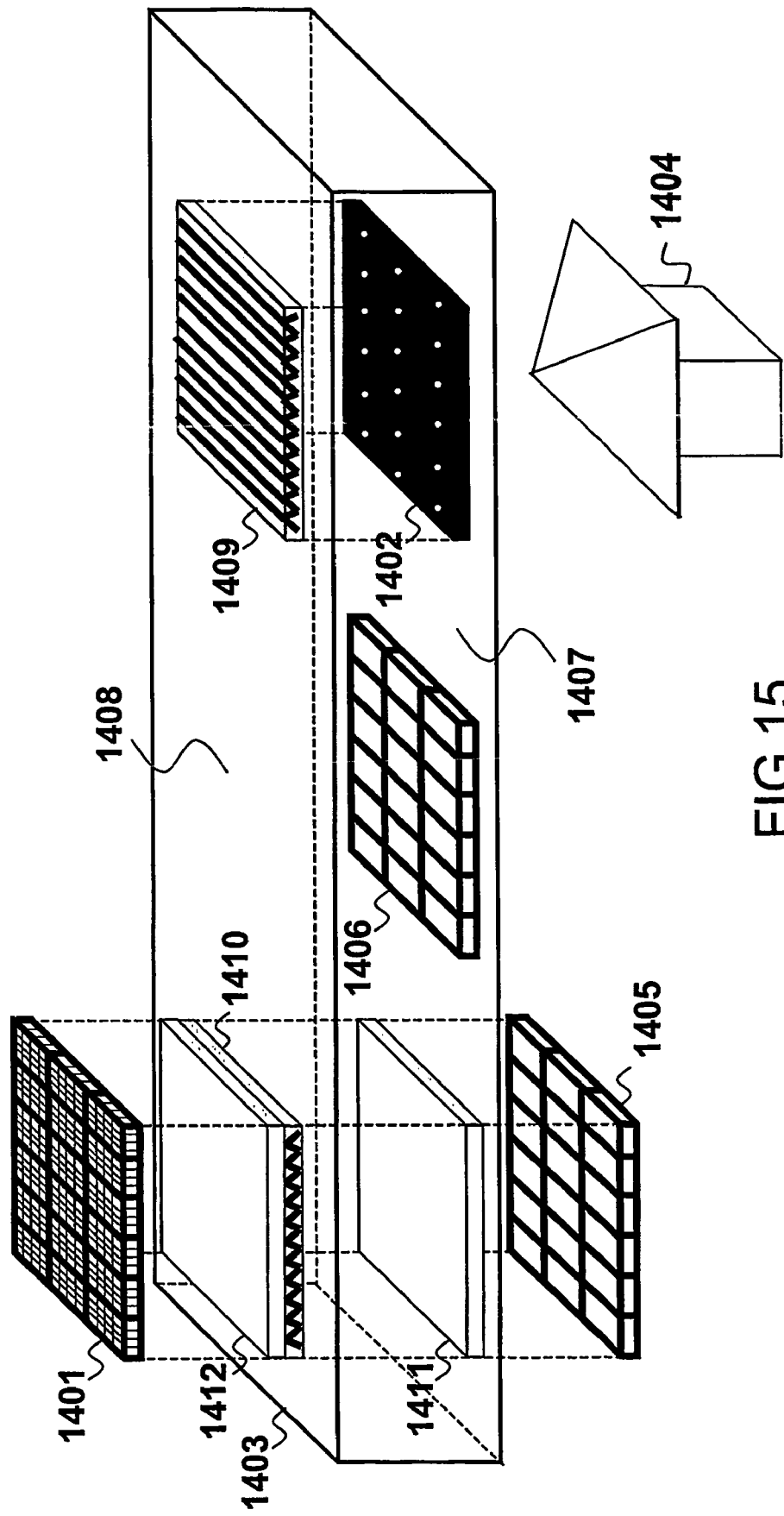
FIG. 15 depicts a three-dimensional view of the third embodiment of a planar system according to the invention.

A second family of a planar system according to the invention for reading data stored on an information carrier is depicted in FIG. 14, and in FIG. 15 in a three-dimensional view. This second family of a planar system comprises:

a waveguide 1403 comprising a first surface 1407 and a second surface 1408. The waveguide is made of plastic or glass, or any material having no birefringence or density variations.

an array of apertures 1402 placed on the side of said first surface for generating a first light beam from an input light beam 1404. The light beam may derive from a laser beam which is expanded by means of an additional waveguide (not-represented).

first reflection means 1409 placed on the side of said second surface for generating a first reflected light beam from said first light beam, a reflective phase-modulator 1406 placed on the side of said first surface for generating a phase-modulated light beam from said first reflected light beam. The phase-modulated light beam comprises an array of light spots as previously described.

second reflection means 1410 placed on the side of said second surface 1408 for generating a second reflected light beam (indicated by the thin arrows pointing downward) from said phase-modulated light beam. The second reflected light beam is perpendicular to the plane of the information carrier 1401.

a reflective polarizer plate 1411 placed on the side of said first surface for generating a third reflected light beam (indicated by the thick arrows pointing upward) from said second reflected light beam, said third reflected light beam being intended to pass through a quarter-wavelength plate 1412 placed between said second reflection means 1410 and the information carrier, and being intended to scan the information carrier 1401. The reflective polarizer plate 1411 is such that it reflects a light beam (corresponding to said second reflected light beam) having a given polarization, and it transmits a light beam (corresponding to said third reflected light beam) having a polarization rotated by 90 degrees compared to said given polarization.

a detector 1405 placed below the reflective polarizer plate 1411 for detecting said data from an output light beam (indicated by the thick arrows pointing downward) generated by the information carrier 1401. The output light beam is transmitted through the quarter-wavelength plate 1412 an through the reflective polarizer plate 1411. The detector, for example of the CMOS type as previously described, advantageously comprises an array of microlenses (not represented) for focusing said output light beam on the sensitive cells of the detector.

This particular embodiment depicted in FIG. 14 and FIG. 15 implies the use of an information carrier 1401 intended to be placed on the side of said second surface 1408, and intended to be read in reflection. This embodiment of the planar system is advantageous since all components are on the same side of the waveguide, while the information carrier in on the opposite side. This arrangement facilitates the implementation in an information carrier reading apparatus.

Preferably, the distance between the first surface 1207-1307-1407 and the second surface 1208-1308-1408 is such that the light beam generated at the output of said array of apertures 1202-1302-1402 is re-imaged on the reflective phase-modulator 1206-1306-1406.

All embodiments of the planar systems have in common that they use the phase-modulator in reflection. Since the light beams passes the reflective phase-modulator layer twice It allows doubling the phase shift that is applied to the light beams (defined by equations 1-4). Similarly as the embodiment depicted in FIG. 9, each liquid crystal cell of the reflective phase-modulator 1206-1306-1406 can be addressed electrically. Liquid crystal on silicon (LCOS) technology can advantageously be used in that case.

Figure 16:
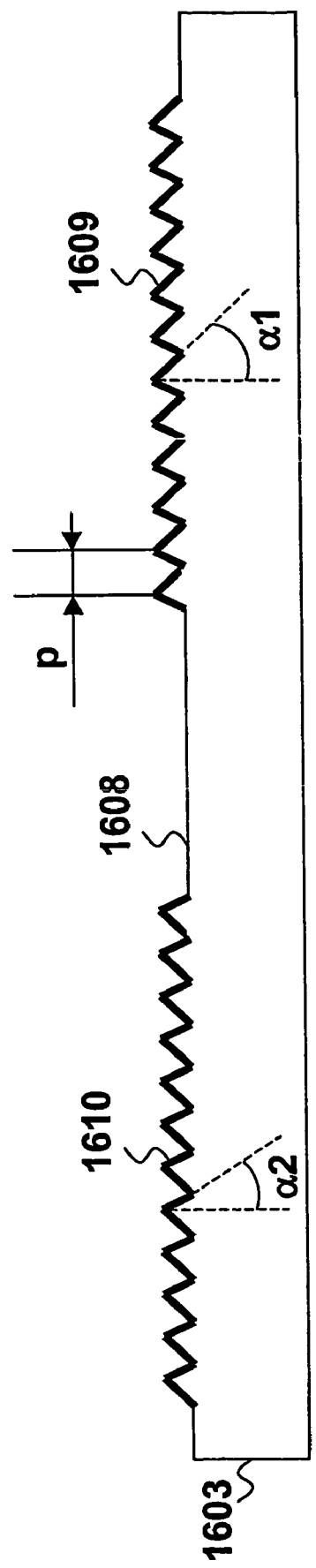
FIG. 16 depicts a detailed view of a component used in the planar systems according to the invention.

FIG. 16 depicts a detailed view of the first reflection means 1609 and second reflection means 1610.

The reflection angle of the first reflected light beam may be determined by the angle $\alpha 1$ of a triangular structure, and the reflection angle of the second reflected light beam may be determined by the angle $\alpha 2$ of a triangular structure, said triangular structures being placed on the side of the second surface 1608 of the waveguide 1603.

The reflection angles may also be determined in choosing the pitch p of the structures on the order of the wavelength $\lambda$ of the input light beam so as to define a blazed grating, the first order diffracted beams being used as output deviated light beams.

Figure 17:
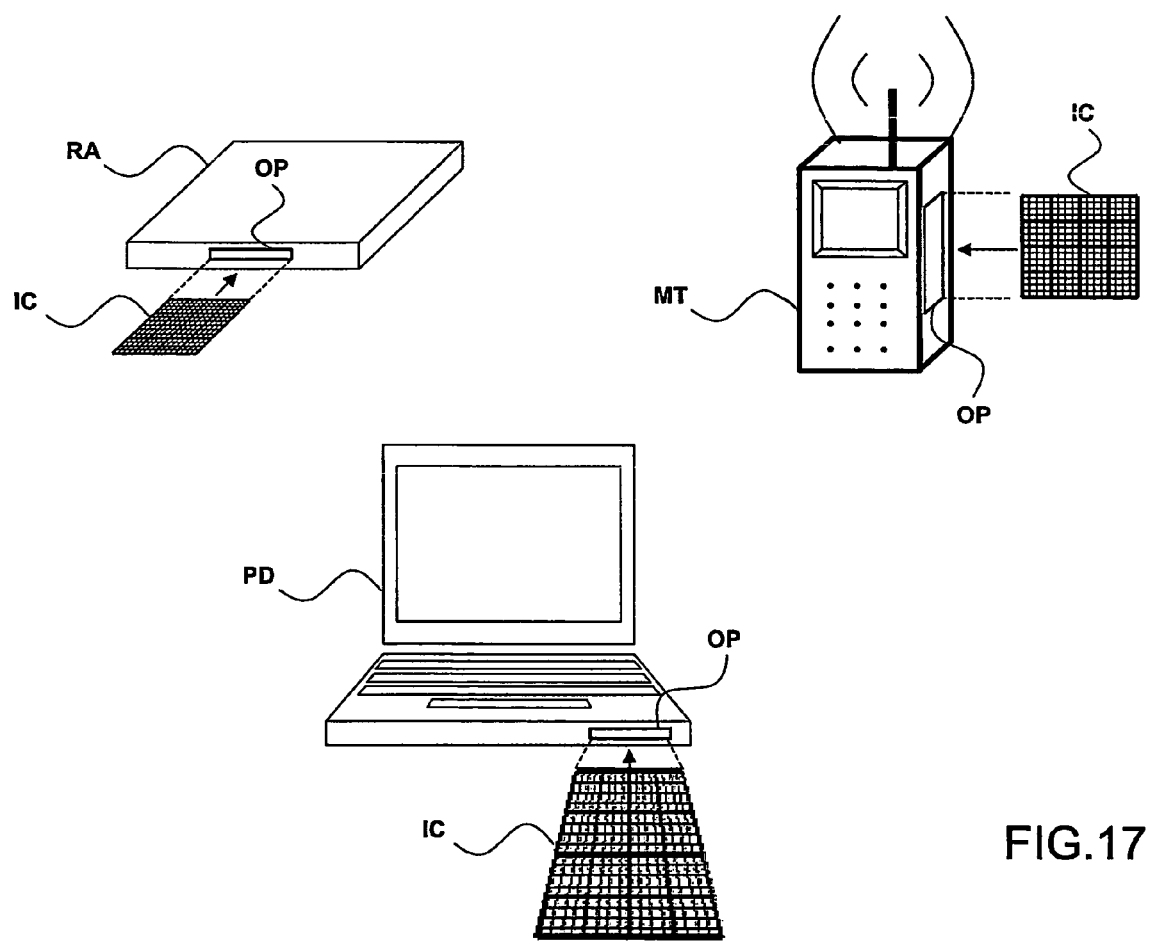
FIG. 17 illustrates various apparatus and devices comprising a system according to the invention.

As illustrated in FIG. 17, the system according to the invention may advantageously be implemented in a reading apparatus RA (e.g. home player apparatus . . . ), a portable device PD (e.g. portable digital assistant, portable computer, a game player unit . . . ), or a mobile telephone MT. These apparatus and devices comprise an opening (OP) intended to receive an information carrier IC as previously described, and a system according to the invention for shifting light spots over said information carrier IC in view of data recovering.

Use of the verb "comprise" and its conjugations does not exclude the presence of elements or steps other than those stated in the claims. Use of the article "a" or "an" preceding an element or step does not exclude the presence of a plurality of such elements or steps.

The invention claimed is:

1. System for reading data stored on an information carrier (1201-1301), said system comprising :
    a waveguide (1203-1303) comprising a first surface (1207-1307) and a second surface (1208-1308),
    an array of apertures (1202-1302) placed on the side of said first surface for generating a first light beam from an input light beam (1204-1304),
    first reflection means (1209-1309) placed on the side of said second surface for generating a first reflected light beam from said first light beam,
    a reflective phase-modulator (1206-1306) placed on the side of said first surface for generating a phase-modulated light beam from said first reflected light beam,
    second reflection means (1210-1310) placed on the side of said second surface for generating a second reflected light beam from said phase-modulated light beam, said second reflected light beam being intended to scan the information carrier (1201-1301),
    a detector (1205-1305) for detecting said data from an output light beam generated by the information carrier (1201-1301).

2. System as claimed in claim 1 where the detector (1205) is placed on the side of said first surface (1207), the information carrier (1201) being intended to be placed between said first surface (1207) and the detector (1205).

3. System as claimed in claim 1 where the detector (1305) is placed on the side of said second surface (1308), system further comprising a reflective polarizer plate (1311) placed between said second reflection means (1310) and the detector (1305), and further comprising a quarter-wavelength plate (1312) placed between said first surface (1307) and the information carrier (1301), the information carrier (1301) being intended to be placed on the side of said first surface (1307).

4. System for reading data stored on an information carrier (1401), said system comprising :
    a waveguide (1403) comprising a first surface (1407) and a second surface (1408), the information carrier (1401) being intended to be placed on the side of said second surface (1408),
    an array of apertures (1402) placed on the side of said first surface for generating a first light beam from an input light beam (1404),
    first reflection means (1409) placed on the side of said second surface for generating a first reflected light beam from said first light beam,
    a reflective phase-modulator (1406) placed on the side of said first surface for generating a phase-modulated light beam from said first reflected light beam,
    second reflection means (1410) placed on the side of said second surface (1408) for generating a second reflected light beam from said phase-modulated light beam,
    a reflective polarizer plate (1411) placed on the side of said first surface for generating a third reflected light beam from said second reflected light beam, said third reflected light beam being intended to pass through a quarter-wavelength plate (1412) placed between said second reflection means (1410) and the information carrier, and being intended to scan the information carrier (1401),
    a detector (1405) placed below the reflective polarizer plate (1411) for detecting said data from an output light beam generated by the information carrier (1401).

5. System as claimed in claim 1, where the distance between the first surface (1207-1307-1407) and the second surface (1208-1308-1408) is such that the light beam generated at the output of said array of apertures (1202-1302-1402) is re-imaged on the reflective phase-modulator (1206-1306-1406).

6. Reading apparatus comprising a system as claimed in claim 1.

7. A portable device comprising a system as claimed in claim 1.

8. A mobile telephone comprising a system as claimed in claim 1.

9. A game player unit comprising a system as claimed in claim 1.

* * * * *